United States Patent [19]

Gal et al.

[11] Patent Number: 5,006,794
[45] Date of Patent: Apr. 9, 1991

[54] MODULE FOR PREVENTING INSTABILITY IN INTEGRATED CIRCUIT TESTERS

[75] Inventors: Laszlo V. Gal, Poway; James E. Judy, Jr.; Kenneth C. Prentiss, both of San Diego, all of Calif.

[73] Assignee: Unisys Corporation, Blue Bell, Pa.

[21] Appl. No.: 188,021

[22] Filed: Mar. 21, 1988

[51] Int. Cl.[5] .................. G01R 31/02; G01R 1/06
[52] U.S. Cl. ....................... 324/158 R; 324/158 P
[58] Field of Search ............ 324/158 R, 158 F, 158 P, 324/73.1; 307/510, 511

[56] References Cited

U.S. PATENT DOCUMENTS 4,473,798  9/1984  Cedrone et al. ............... 324/158 F Primary Examiner—Ernest F. Karlsen
Attorney, Agent, or Firm—Charles J. Fassbender; Mark T. Starr

[57] ABSTRACT

A module for preventing instability in systems which test integrated circuit chips resides between the tester unit and the chip that is being tested. This module is characterized as including a plurality of phase-shifting circuits which couple respective output signals from output transistors on the chip onto signal lines to the tester unit. Each phase-shifting circuit includes an inductor which counteracts and cancels any capacitive phase shift that is produced by the input impedance of the corresponding signal line to the tester unit.

11 Claims, 4 Drawing Sheets $$A_v = \frac{V_o}{V_i} = -\left(\frac{sL_c}{Z_e}\right)\left(\frac{g_m}{g_m + \frac{1}{Z_e} + \frac{1}{Z_b}}\right)$$

$$Z_i = \frac{V_i}{I_b} = Z_b + Z_e(1 + g_m Z_b)$$

where $Z_b = R_b \| C_b$ $$G(s) = A_v$$

$$H(s) = \frac{-Z_i \| R_p}{Z_i \| R_p + \frac{1}{sC_c}}$$

Fig. 6

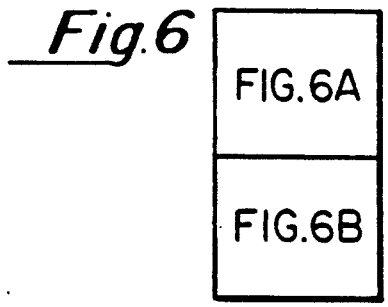

Fig. 6A eq.1 $\quad G(s)H(s) = \left(\dfrac{sL_c}{Z_e}\right)\left(\dfrac{g_m}{g_m + \dfrac{1}{Z_e} + \dfrac{1}{Z_b}}\right)\left(\dfrac{Z_i \| R_p}{Z_i \| R_p + \dfrac{1}{sC_c}}\right)$ eq.2 $\quad g_m Z_e \gg 1$
$\quad\quad\; Z_b \gg Z_e$ eq.3 $\quad G(s)H(s) = sL_c \left(\dfrac{g_m}{1+g_m Z_e}\right)\left(\dfrac{R_p \omega_T Z_e C_c}{R_p \omega_T Z_e C_c + R_p + \dfrac{\omega_T Z_e}{s}}\right)$
$\quad\quad$ where $\omega_T = \dfrac{g_m}{C_b}$ eq.4 $\quad$ stability $\rightarrow$ zeros of $1+G(s)H(s)$ in LHSP eq.5 $\quad$ if $Z_e = R_e$
$\quad\quad$ then $F(s) = 1 + s\left(\dfrac{R_p}{\omega_T R_e} + R_p C_c\right) + s^2 \left(\dfrac{L_c R_p C_c}{R_e}\right)$

Fig. 6B eq. 6 if $Z_e = \dfrac{1}{sC_e}$ then $F(s) = \left(1 + s\dfrac{C_E}{g_m}\right)\left(1 + sR_pC_c + s^2\dfrac{R_pC_E}{\omega_T}\right) + s^3 L_c C_E R_p C_c$ eq. 7 $F(s) = s_0^3 + s_0^2\left(\dfrac{3.6 + 1.5C_E + 0.45N}{1.8C_E + 0.22C_EN}\right) + s_0\left(\dfrac{5}{1.8C_E + 0.22C_EN}\right)$
$+ \left(\dfrac{1}{1.8C_E + 0.22C_EN}\right)$ where $s_0 = s10^{10}$ eq. 8 if $Z_e = sL_e$ then $F(s) = (1 + g_m L_e s)(R_p + \omega_T L_e + sR_p\omega_T C_c L_e)$
$+ s^2 g_m L_c R_p \omega_T C_c L_e$ eq. 9 $Z_e = j\omega L_1 + \dfrac{R_e[(1 - \omega^2 L_2 C_e)^2 - j\omega C_e R_e(1 - \omega^2 L_2 C_e)]}{(1 - \omega^2 L_2 C_e)^2 + \omega^2 R_e^2 C_e^2}$ eq. 10 $Z_e$ = inductive if $L_1 > R_e^2 C_e$ eq. 11 $Z_e$ = inductive if $L_2 > \dfrac{1}{\omega^2 C_e}$

MODULE FOR PREVENTING INSTABILITY IN INTEGRATED CIRCUIT TESTERS

BACKGROUND OF THE INVENTION

This invention relates to systems which test integrated circuit chips; and more particularly, it relates to modules for preventing instability and oscillations in such systems.

In the prior art, an integrated circuit chip was tested for operability by the means of a tester unit which sent sequences of input signals to the chip, and which received and checked resulting output signals from the chip. One such tester unit, for example, is model 20 from Sentry Corporation. Typically, the tester is quite large and bulky, and it is located several feet from the chip that is being tested. That chip is held in place during the test by a very delicate fixture; and conductors, which are several feet long, carry signals between the tester and the chip.

Such systems have worked satisfactorily in the past without any instability or oscillations. However, the present inventors have observed that such systems go into unstable oscillation when the number of output signals from the chip is increased above a certain number. Further, the present inventors have determined that these oscillations are attributed to certain parasitic capacitances and parasitic inductances in the transistors on the chip which drive the output signals and the circuitry which couples to them to the tester. Due to these parasitic components, they have determined, a positive feedback occurs in the chip that is under test which results in uncontrolled oscillations in the output signal.

Accordingly, a primary object of the invention is to provide an interface module which resides between the tester unit and the chip that is being tested, and which operates to prevent the above described oscillations.

BRIEF SUMMARY OF THE INVENTION

In accordance with the invention, a tester interface module is provided which resides between the tester and the integrated circuit chip. This module is characterized as including a plurality of phase-shifting circuits which couple respective output signals from the output transistors on the chip onto the signal lines to the tester unit. And, each phase-shifting circuit includes an inductor which counteracts and cancels any capacitive phase shift that is produced by the input impedance of one signal line to the tester unit.

BRIEF DESCRIPTION OF THE DRAWINGS

Various features and advantages of the invention are described herein in conjunction with the accompanying drawings wherein:

FIG. 6 is a set of equations which analyzes the stability requirements on the FIG. 5 circuit.

DETAILED DESCRIPTION OF THE INVENTION

Figure 1:
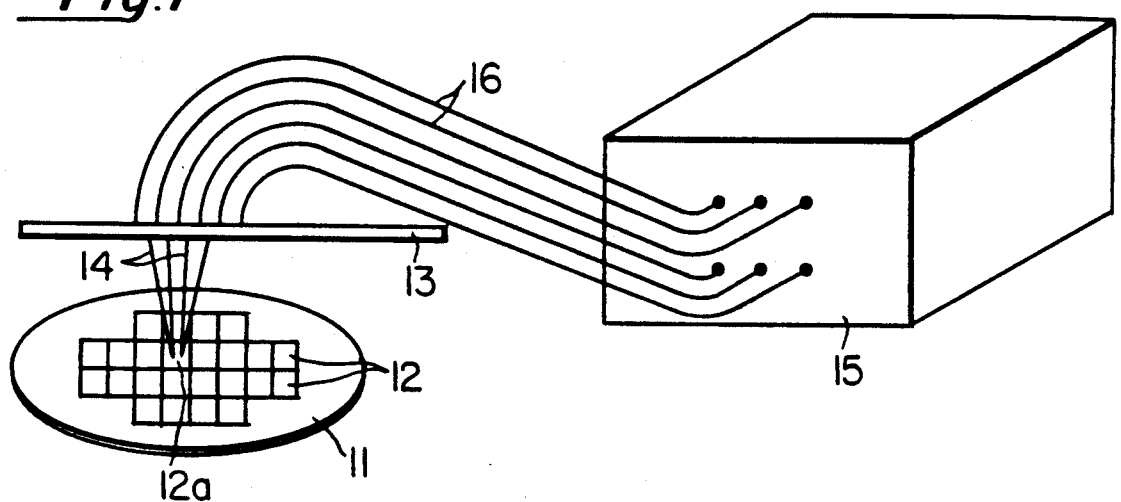
FIG. 1 illustrates a system for testing integrated circuit chips which incorporates an interface module that is constructed according to the invention.

Referring now to the figures, a system which tests the operability of integrated circuit chips, and which is constructed in accordance with the invention to prevent oscillations, will be described in detail. An overall picture of that system is given in FIG. 1. There, reference numeral 11 indicates a semiconductor wafer; reference numeral 12 indicates several integrated circuit chips that are on wafer 11; and reference numeral 12a indicates a particular chip that is being tested.

Also in FIG. 1, reference numeral 13 indicates an interface module which prevents oscillations in the FIG. 1 system in accordance with the invention; reference numeral 14 indicates a set of probes which carry signals between chip 12a and interface module 13; reference numeral 15 indicates a tester unit; and reference numeral 16 indicates a set of leads which carries signals between tester unit 15 and interface module 13. All of these components are interconnected as shown.

In operation, tester unit 15 sends a set of test signals over a portion of the conductors 16 to interface module 13. Those signals are then sent via a portion of the probes 14 to chip 12a which is being tested. In chip 12a, the received signals activate various integrated circuits; and they in turn cause certain transistors to generate output signals that are sent via a portion of the probes 14 to interface module 13. There, the output signals are phase-shifted in accordance with the invention; and the phase-shifted signals are sent over a portion of the conductors 16 back to tester unit 15 which compares them to a predetermined response. During the testing of chip 12a, the above-described signal sequence is repeated thousands of times.

Depending on the complexity of the circuitry on chip 12a, the total number of probes 14 as well as the number of conductors 16 will be between ten and three hundred. Typically, the length of each probe 14 is about two-four inches; whereas typically, the length of each conductor 16 is about three-ten feet. This difference in length is due to the fact that the chips 12 are very fragile, and so the probes 14 must be small and delicate; whereas tester 16 is large and bulky.

Figure 2:
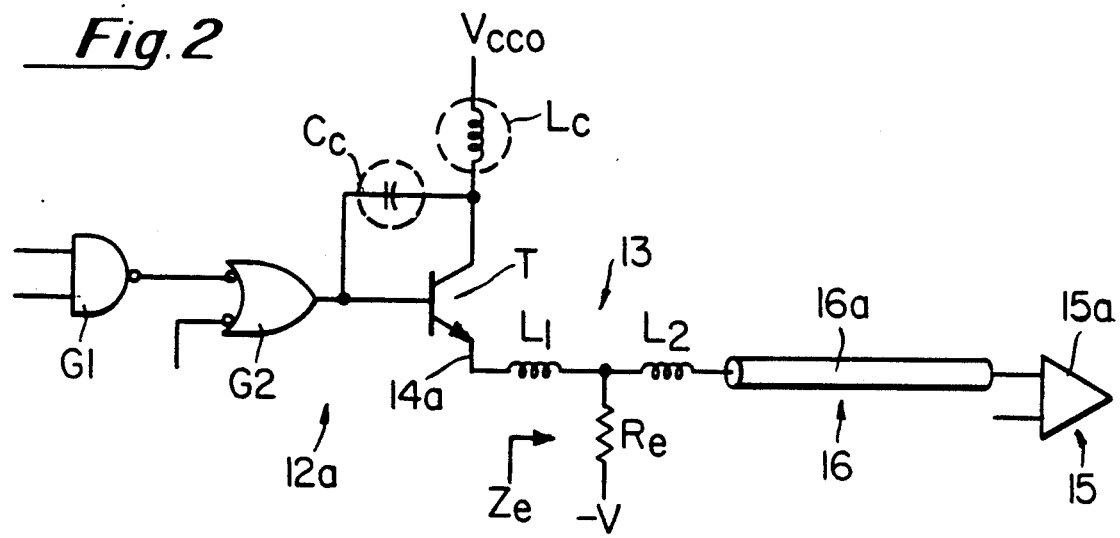
FIG. 2 illustrates the circuit through which a signal passes in the system of FIG. 1 as it travels from the integrated circuit chip to the tester unit.

Turning now to FIG. 2, it shows the circuitry which is involved in sending signals from chip 12a back to tester unit 15. In FIG. 2, logic gates $G_1$ and $G_2$, plus an output transistor T, are on chip 12a. Probe 14a is one of the probes 14. Two inductors $L_1$ and $L_2$, plus a resistor $R_e$ and a bias voltage $-V$ are in the interface module 13. A coaxial cable 16a is one of conductors 16, and a comparator 15a is in tester unit 15. All of these components are interconnected as illustrated.

Also associated with output transistor T is a capacitor $C_c$ and an inductor $L_c$. Capacitor $C_c$ is a parasitic capacitor that occurs at the collector-base junction of transistor T. Typically, capacitor $C_c$ has a magnitude of 0.1–1.0 picofarads. Similarly, inductor $L_c$ is a parasitic inductor that occurs in the probes 14 which carry the DC bias voltage $V_{cco}$ to all output transistors on chip 12a. Typically, inductor $L_c$ has a magnitude of 2–20 nanohenrys.

Figure 3:
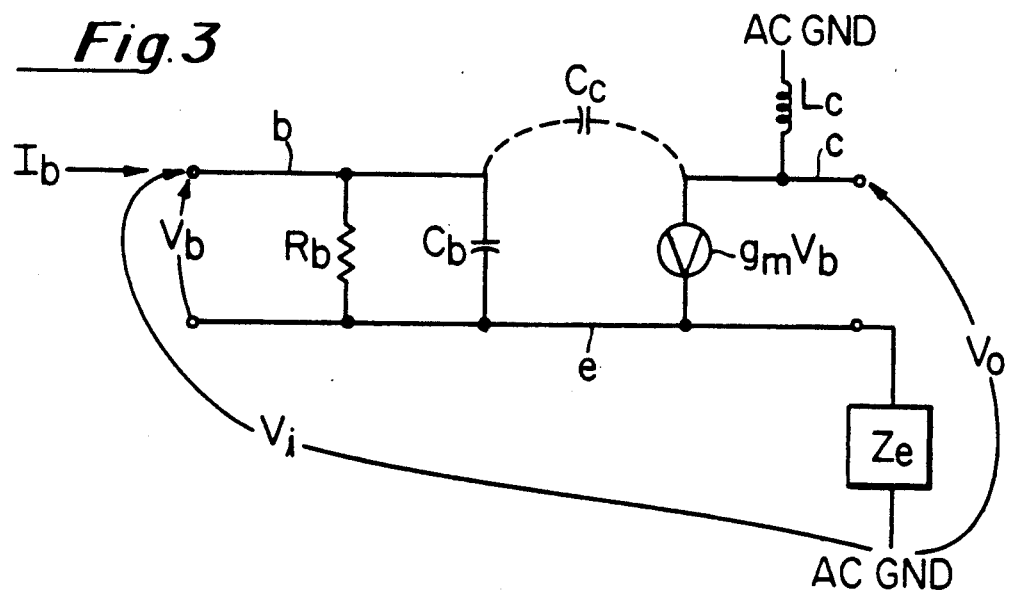
FIG. 3 is the pi equivalent representation of the circuit of FIG. 2.

Consider next FIG. 3. It is an AC equivalent circuit of the FIG. 2 circuit in which transistor T is replaced with its pi equivalent representation. That is, in FIG. 3, resistor $R_b$, capacitor $C_b$, and current source $g_m V_b$ are the pi equivalent components of output transistor T. Also in FIG. 3, capacitor $C_c$ couples the transistor's collector to its base; and inductor $L_c$ couples the transistor's collector to the DC bias voltage $V_{cco}$ (which is AC ground). An impedance $Z_e$, which is the total equivalent impedance of components $L_1$, $L_2$, $R_e$, 15a, and 16a, connects between the transistor's emitter and bias voltage $-V$ (which also is AC ground). And, a pullup resistor $R_p$ from gate G2 couples the base of transistor T to a pullup voltage (which is AC ground).

Utilizing Kirchhoff's voltage and current laws, mathematical expressions for the open loop voltage gain $A_v$ and open loop input impedance $Z_i$ of the FIG. 3 circuit can now be derived. Those expressions are given in FIG. 4. In deriving those open loop expressions, the presence of the feedback capacitor $C_c$ is ignored. This is indicated in FIG. 3 by a dashed line connection of capacitor $C_c$ to the base and collector terminals.

Figures 4, 5:
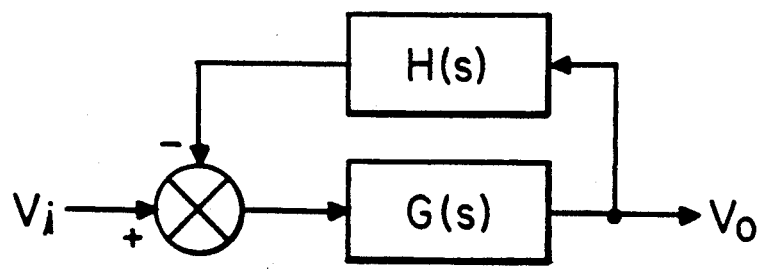
FIG. 4 gives the mathematical expressions for the open loop voltage gain and open loop input impedance of the FIG. 3 circuit.
FIG. 5 is a closed loop control system representation of the circuit of FIG. 3 which incorporates the open loop expression of FIG. 4.

Now, in order to account for the feedback effect of capacitor $C_c$, an analysis using the FIG. 5 circuit can be performed. In FIG. 5, G(s) is the forward transfer function; and it equals the open loop gain $A_v$ of FIG. 4. Also in FIG. 5, H(s) is the feedback transfer function; and it equals a ratio involving the open loop input impedance $Z_i$, pullup resistor $R_p$, and the impedance of capacitor $C_c$. They act as a voltage divider by which a portion of the output voltage $V_o$ is fed back to the base of transistor T where it is summed with the input voltage $V_i$.

Utilizing the expressions for $A_v$ and $Z_i$ as given in FIG. 4, the product G(s)H(s) can be expanded as is done by equation 1 in FIG. 6. Then, equation 1 can be simplified based on the two constraints that are given in equation 2 of FIG. 6. Those constraints are met by most, if not all, integrated circuit logic gates. Applying the constraints of equation 2 to equation 1 yields equation 3.

In order to insure that the FIG. 5 circuit is stable, the zeros of the characteristic equation of $1+G(s)H(s)=0$ must be in the left half of the s-plane. This is in accordance with the Nyquist criteria, and it is stated by equation 4. If the zeros of $1+G(s)H(s)=0$ lie in the left half of the s-plane, then the real part of the zeros will be negative, and so the corresponding terms in the time domain will damp out. Otherwise, the corresponding time domain term will increase with time.

Suppose now that the phase angle of impedance $Z_e$ is 0° (i.e., suppose $Z_e$ is made purely resistive). In that case, the characteristic equation of $1+G(s)H(s)=0$ is as stated by equation 5, and its zeros will be in the left half of the s-plane. That is because equation 5 is of the form $As^2+Bs+C=0$, and so its roots are $[-B\pm\text{SQRT}(B^2-4AC)]/2A$. Such roots have negative real parts when A, B, C are real and positive.

Next, suppose the input impedance $Z_e$ has a phase shift of $-90°$ (i.e., suppose $Z_e$ is made purely capacitive). In that case, the characteristic equation of $1+G(s)H(s)=0$ is as stated by equation 6. Its zeros can be in the left half or the right half of the s-plane since it is a cubic equation of the form $As^3+Bs^2+Cs+D=0$ where A, B, C, D are real and positive. To verify the above point, a computer was used to calculate the zeros of equation 6 under the condition where the various equation parameters had some practical values. In particular, the following parameters were used: $W_T=6\times 10^{10}$, $C_c=0.6$ picofarads, $R_p=300$ ohms, $L_e=10$ microhenry per output signal pin, $L_c=10$ microhenry per $V_{cco}$ connection, $g_m=1$, and $R_e=50$ ohms.

Under the above conditions, equation 6 reduces to equation 7 where N is the number of output signals. Solving equation 7 for its zeros by a computer program yields the following results:

| | |
|---|---|
| — | A $C_E$ of 20 picofarads produces zeros with positive real parts (i.e., instability) whenever N exceeds 60; |
| — | A $C_E$ of 30 picofarads produces zeros with positive real parts whenever N exceeds 44; |
| — | A $C_E$ of 40 picofarads produces zeros with positive real parts whenever N exceeds 38; |
| — | A $C_E$ of 50 picofarads produces zeros with positive real parts whenever N exceeds 34; |
| — | A $C_E$ of 60 picofarads produces zeros with positive real parts whenever N exceeds 32; |
| — | A $C_E$ of 90 picofarads produces zeros with positive real parts whenever N exceeds 30. |

Next, suppose that the total phase shift of the impedance $Z_e$ is $+90°$ (i.e., suppose $Z_e$ is made purely inductive). In that case, the characteristic equation of $1+G(s)H(s)=0$ is as stated by equation 8. Its zeros will be in the left half of the s-plane since it is of the form $As^2+Bs+C=0$ just like equation 3.

In view of the above results, the conclusion can be made that the equation 1 stability criteria will be met if the total phase shift of the emitter impedance $Z_e$ is made to lie between 0° and $+90°$. Consequently, it is the function of the tester interface module 14 to insure that any capacitive phase shift which is produced by the input impedance of a signal line 16a to tester unit 15 is counteracted and cancelled by a larger inductive phase shift in the interface module.

Considering now equation 9, it gives a mathematical expression for emitter impedance $Z_e$ as shown in FIG. 2 under the conditions where the impedance of cable 16a and comparator 15a is approximated by a capacitor $C_e$. This is a simplified but very accurate approximation. Any resistive component of the impedance of cable 16a and comparator 15a will be much larger than the paralleled resistor $R_e$ of interface module 14, and so the larger resistor can be ignored.

Equation 10 says that emitter impedance $Z_e$ of equation 9 will be inductive if the inductor $L_1$ is greater than $(R_e)^2 C_e$. This is true even if inductor $L_2$ is zero (i.e., even if inductor $L_2$ is left out of the FIG. 2 circuit). Alternatively, as is stated by equation 11, emitter impedance $Z_e$ will be inductive if inductor $L_2$ is greater than $1/w^2 C_e$. Equation 11 is true even if inductor $L_1$ is zero (i.e., even if inductor $L_1$ is left out of the FIG. 2 circuit).

A preferred embodiment of the invention has now been described in detail. In addition, however, many changes and modifications can be made to these details without departing from the nature and spirit of the invention. Accordingly, it is to be understood that the invention is not limited to the above details, but is defined by the appended claims.

What is claimed is:

1. A system which tests the operability of an integrated circuit chip; said system being of a type in which a plurality of output transistors on said chip send output signals over respective signal lines to a tester unit which checks the state of the output signals; wherein:

each output transistor has an input node and feedback from said output signals to said input node; and, disposed between said chip and said signal lines is an interface module which prevents said feedback from inducing oscillations in said output signals;

said interface module being characterized as including a plurality of phase shifting circuits that respectively couple said output signals from said output transistors onto said signal lines to said tester unit;

each phase shifting circuit including an inductor which together with the input impedance of one signal line to said tester unit produces a net positive phase shift of up to $+90°$.

2. A system according to claim 1 wherein each phase shifting circuit includes one inductor in series with a respective output transistor and a respective signal line, together with one resistor between said respective signal line and a DC bias voltage.

3. A system according to claim 2 wherein said one inductor is larger in magnitude than the square of said one resistor times any capacitive component in the input impedance of one signal line to said tester unit.

4. A system according to claim 1 wherein each phase shifting circuit includes one inductor in series with a respective output transistor and a respective signal line, together with one resistor between said respective output transistor and a DC bias voltage.

5. A system according to claim 4 wherein said one inductor is larger in magnitude than the reciprocal of any capacitive component in the input impedance of one said signal line to said tester unit times the square of the frequency of said output signals.

6. A system according to claim 1 wherein each phase shifting circuit includes a pair of inductors in series with a respective output transistor and a respective signal line, together with a resistor between said pair of inductors and a DC bias voltage.

7. A system according to claim 1 wherein said inductor of each phase shifting circuit ranges from twenty nanohenrys to three hundred nanohenrys.

8. A system according to claim 1 wherein said output transistors on said chip are bipolar transistors and said feedback includes a collector-base capacitance and a collector inductance.

9. A system according to claim 3 wherein said output transistors on said chip are bipolar transistors and said feedback includes a collector-base capacitance and a collector inductance.

10. A system according to claim 5 wherein said output transistors on said chip are bipolar transistors and said feedback includes a collector-base capacitance and a collector inductance.

11. A system according to claim 7 wherein said output transistors on said chip are bipolar transistors and said feedback includes a collector-base capacitance and a collector inductance.

* * * * *